(12) United States Patent
Park et al.

(10) Patent No.: US 8,987,888 B2
(45) Date of Patent: Mar. 24, 2015

(54) SEMICONDUCTOR PACKAGE AND SEMICONDUCTOR PACKAGE MODULE HAVING THE SAME

(75) Inventors: Mi Jin Park, Gyunggi-do (KR);
Christian Romero, Gyunggi-do (KR);
Seung Wook Park, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 356 days.

(21) Appl. No.: 13/368,439

(22) Filed: Feb. 8, 2012

(65) Prior Publication Data
US 2013/0127053 A1     May 23, 2013

(30) Foreign Application Priority Data
Nov. 17, 2011    (KR) ................. 10-2011-0120353

(51) Int. Cl.
*H01L 23/48*     (2006.01)
*H01L 23/52*     (2006.01)
*H01L 23/498*    (2006.01)

(52) U.S. Cl.
CPC . *H01L 23/49827* (2013.01); *H01L 2224/73265* (2013.01); *H01L 2224/16225* (2013.01); *H01L 23/49838* (2013.01)

USPC .......................................... 257/692; 438/107

(58) Field of Classification Search
CPC ................. H01L 23/49827; H01L 23/49838;
H01L 2224/73265; H01L 2224/16225
USPC .......................................... 257/692; 438/107
See application file for complete search history.

(56) References Cited

U.S. PATENT DOCUMENTS 5,956,605 A *   9/1999   Akram et al. ................. 438/613
6,664,483 B2 *   12/2003   Chong et al. .................. 174/261
6,861,742 B2 *   3/2005   Miyamoto et al. ............ 257/693

FOREIGN PATENT DOCUMENTS

KR      1020110032158      3/2011

* cited by examiner

*Primary Examiner* — Nicholas Tobergte
(74) *Attorney, Agent, or Firm* — Ladas & Parry, LLP

(57) ABSTRACT

Disclosed herein is a semiconductor package including: a semiconductor chip having a bonding pad; and a first substrate including a rerouting layer having short type rerouting patterns electrically connected with the bonding pad and formed to be seamlessly connected with each other and a plurality of open type rerouting patterns separately formed on the same layer as the short type rerouting patterns and connection terminals for signal connection each formed on the open type rerouting patterns.

15 Claims, 3 Drawing Sheets

SEMICONDUCTOR PACKAGE AND SEMICONDUCTOR PACKAGE MODULE HAVING THE SAME

CROSS REFERENCE TO RELATED APPLICATION

This application claims the benefit of Korean Patent Application No. 10-2011-0120353, filed on Nov. 17, 2011, entitled "Semiconductor Package And Semiconductor Package Module Having The Same", which is hereby incorporated by reference in its entirety into this application.

BACKGROUND OF THE INVENTION

1. Technical Field

The present invention relates to a semiconductor package and a semiconductor package module having the same.

2. Description of the Related Art

In a semiconductor industry, one of the main tendencies of a technology development has focused on the reduction in a size of a semiconductor device. Even in the semiconductor package field, with the sudden increase in a demand of a small computer, portable electronic devices, or the like, a semiconductor package such as a fine pitch ball grid array (FBGA) package or a chip scale package (CSP), or the like, capable of implementing a plurality of pins while being formed at a small size have been developed.

The semiconductor packages such as the fine pitch ball grid array package, the chip scale package, or the like, that are being currently developed has physical advantages such as miniaturization, lightness, or the like. However, the semiconductor packages do not yet secure reliability equivalent to a plastic package according to the prior art and have the reduced competitive price due to the increased cost of materials consumed during a production process and the increased processing cost.

In particular, a representative type of the current chip scale package, a so-called micro ball grid array (micro BGA (μBGA)) has excellent characteristics more than the fine pitch ball grid array or the chip scale package, but has also the reduced reliability and competitive price.

In order to overcome the disadvantages, as one type of the developed packages, there is a so-called wafer level chip scale package (wafer level CSP (WL-CSP)) using redistribution or rerouting of bonding pails of semiconductor chips formed on a wafer.

The wafer level chip scale package using the redistribution has a structural feature that the bonding pads on the semiconductor substrate is directly redistributed with other pads having a larger size and then, external connection terminals such as solder balls are formed thereon.

Meanwhile, the semiconductor package according to the prior art is disclosed in Korean Patent Laid-Open Publication No. 2011-0032158.

The semiconductor package according to the prior art may be configured by a multilayer of two layers or more according to expandability of rerouting patterns. As such, the process cost, the number of processes, and the process time may be increased, due to the multilayer manufacturing of the semiconductor package.

SUMMARY OF THE INVENTION

The present invention has been made in an effort to provide a semiconductor package and a semiconductor package module having the same capable of simplifying a manufacturing process.

Further, the present invention has been made in an effort to provide a semiconductor package and a semiconductor package module having the same capable of reducing manufacturing process costs.

According to a preferred embodiment of the present invention, there is provided a semiconductor package, including: a semiconductor chip having a bonding pad; and a first substrate including a rerouting layer having short type rerouting patterns electrically connected with the bonding pad and formed to be seamlessly connected with each other and a plurality of open type rerouting patterns separately formed on the same layer as the short type rerouting patterns and connection terminals for signal connection each formed on the open type rerouting patterns.

The semiconductor package may be a wafer level package (WLP).

The semiconductor package may be formed using a semiconductor wafer.

The first substrate may further include: an insulating layer on which the rerouting layer is formed; and an external connection terminal formed in the short type rerouting pattern.

The semiconductor package may further include a solder resist layer having an opening part formed on the insulating layer to cover the rerouting layer and exposing a portion on which the external connection terminal and the connection terminals for signal connection are formed.

The external connection terminal may be a solder ball.

The connection terminal for signal connection may be a solder ball.

According to a preferred embodiment of the present invention, there is provided a semiconductor package module, including: a semiconductor package including a semiconductor chip having a bonding pad, and a first substrate including a rerouting layer having short type rerouting patterns electrically connected with the bonding pad and formed to be seamlessly connected with each other and a plurality of open type rerouting patterns separately formed on the same layer as the short type rerouting patterns and connection terminals for signal connection each formed on the open type rerouting patterns; and a second substrate having connection pads for signal connection to electrically connect the open type rerouting patterns separately formed by being bonded with the connection terminal for signal connection.

The semiconductor package may be a wafer level package (WLP).

The semiconductor package may be formed using a semiconductor wafer.

The first substrate may further include: an insulating layer on which the rerouting layer is formed; and an external connection terminal formed in the short type rerouting pattern.

The semiconductor package module may further include a solder resist layer having an opening part having formed on the insulating layer to cover the rerouting layer and exposing a portion on which the external connection terminal and the connection terminals for signal connection are formed.

The external connection terminal may be a solder ball.

The connection terminal for signal connection may be a solder ball.

The second substrate may be a printed circuit board (PCB).

DESCRIPTION OF THE PREFERRED EMBODIMENTS

Figure 1:
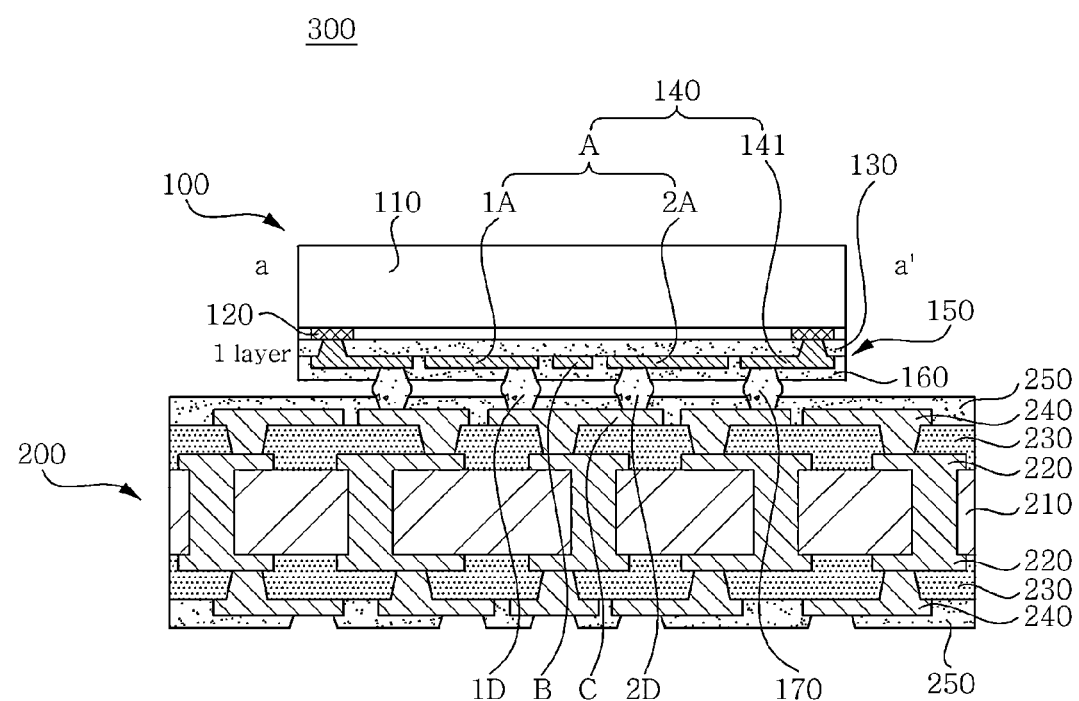
FIG. 1 is a cross-sectional view showing a structure of a semiconductor package module according to a preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from preferred embodiments and the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted. In the description, the terms "first", "second", and so on are used to distinguish one element from another element, and the elements are not defined by the above terms.

Hereinafter, preferred embodiments of the present invention will be described in detail with reference to the accompanying drawings.

Figure 2:
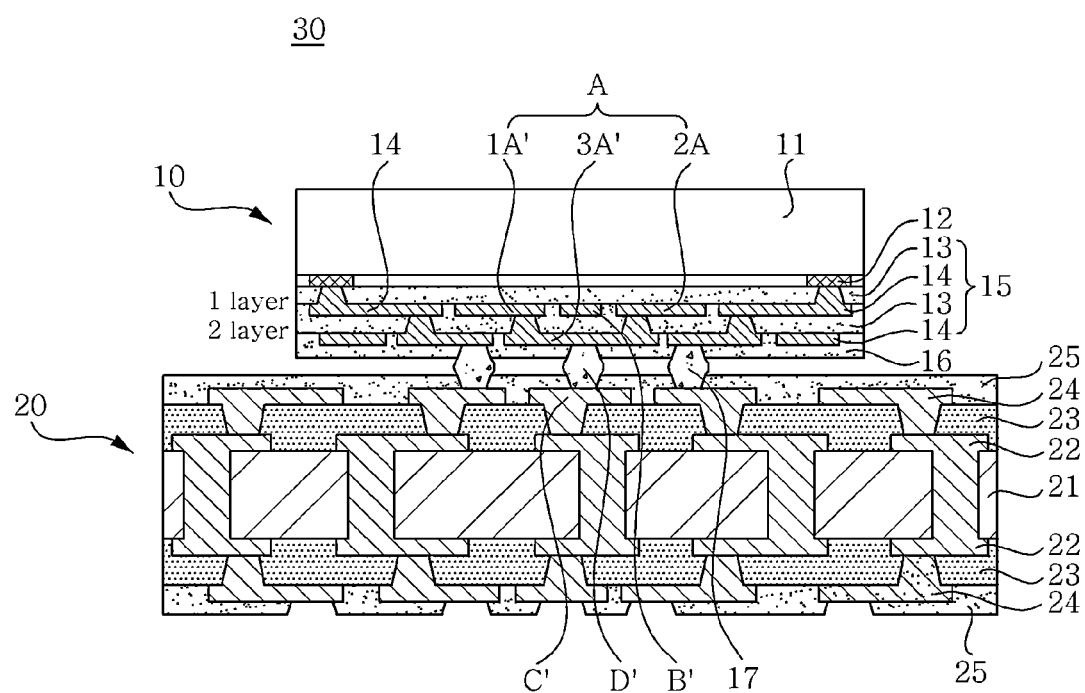
FIG. 2 is a cross-sectional view showing a structure of the existing semiconductor package module for comparing with a structure of the semiconductor package module according to the preferred embodiment of the present invention.
Figure 3:
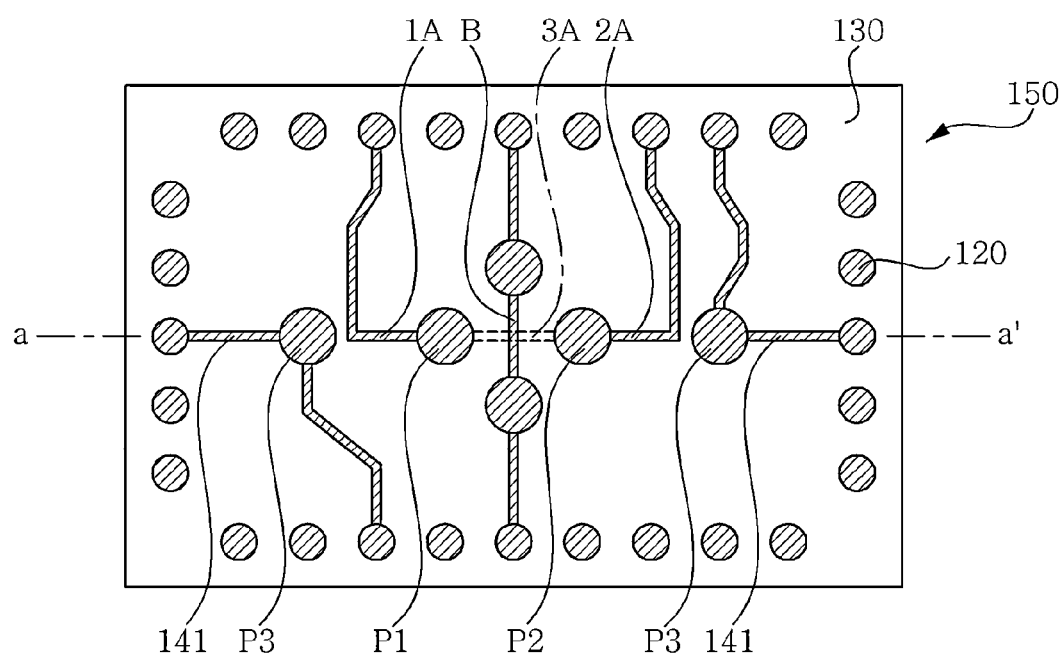
FIG. 3 is a plan view showing a bottom surface of the semiconductor package module according to the preferred embodiment of the present invention.

FIG. 1 is a cross-sectional view showing a structure of a semiconductor package module according to a preferred embodiment of the present invention, FIG. 2 is a cross-sectional view showing a structure of the existing semiconductor package module for comparing with a structure of the semiconductor package module according to the preferred embodiment of the present invention, and FIG. 3 is a plan view showing a bottom surface of the semiconductor package module according to the preferred embodiment of the present invention.

Referring to FIG. 1, a semiconductor package module 300 according to a preferred embodiment of the present invention may include a semiconductor package 100 and a second substrate 200 bonded to the semiconductor package 100.

In the preferred embodiment of the present invention, the semiconductor package 100 may be a wafer level package (WLP), but is not limited thereto. For example, the semiconductor package 100 may be a ball grid array (BGA), a chip scale package (CSP), or the like.

The semiconductor package according to a preferred embodiment of the present invention may include a semiconductor chip 110 and a first substrate 150.

The semiconductor chip 110 may be provided with a circuit unit (not shown). The circuit unit (not shown) processes input signals input from the outside to generate data signals. The bonding pad 120 may be electrically connected with the circuit unit (not shown) to transfer external input signals to the circuit unit (not shown) or output the data signals processed from the circuit unit (not shown) to the outside.

Here, the bonding pad 120 may be made of conductive materials. For example, the bonding pad 120 may be made of aluminum (Al), gold (Au), silver (Ag), copper (Cu), or an alloy thereof, but is not limited thereto.

In the preferred embodiment of the present invention, a first substrate 150 may include an insulating layer 130 and a rerouting layer 140 formed on the insulating layer 130.

In this case, as the insulating layer 130, a resin insulating layer may be used. As the resin insulating layer, a thermosetting resin such as an epoxy resin, a thermoplastic resin such as polyimide, or a resin having a reinforcing material such as glass fiber or inorganic filler impregnated therein, for example, prepreg, may be used. In addition, a thermosetting resin and/or a photocurable resin, or the like, may be used, but the material of the resin insulating layer is not limited thereto.

In the preferred embodiment of the present invention, the rerouting layer 140 may include short type rerouting patterns 141 and B electrically connected with the bonding pad 120 of the semiconductor chip 110 and formed to be seamlessly connected with each other and a plurality of open type rerouting patterns A separately formed on the same layer as the short type rerouting patterns 141 and B.

In the preferred embodiment of the present invention, the rerouting layer 140 may be a member that electrically connects the external devices with the semiconductor chip 110.

In the preferred embodiment of the present invention, the rerouting layer 140 may be made of aluminum (Al), copper (Cu), tin (Sn), nickel (Ni), gold (Au), platinum (Pt), and an alloy thereof, but is not limited thereto. For example, the rerouting layer 140 may be formed of a multilayer film that is sequentially formed of copper/gold/nickel.

In the preferred embodiment of the present invention, the above-mentioned short type rerouting patterns 141 and B are used as a term called patterns that may be completely connected seamlessly on the same layer and may be electrically connected with each other.

In addition, even though the open type rerouting pattern A described above in the preferred embodiment of the present invention is a pattern to be connected seamlessly on the same layer for substantially transferring the same signal, the above-mentioned open type rerouting pattern A is used as a term called a pattern separately formed since the open type rerouting pattern A cannot be connected due to another pattern crossing them.

For example, as shown in FIG. 3, even though open type rerouting patterns 1A and 2A are formed in the single pattern 1A, 2A, or 3A that is electrically connected for substantially transferring the same signal, in order to prevent (pattern '3A' is not formed) a short with 'B' that is another pattern formed crossing therebetween, the open type rerouting patterns 1A and 2A mean the patterns formed in a broken state.

However, referring to FIG. 2, in order to electrically connect pattern 1A' and pattern 2A' that cannot be connected on the same layer in the prior art, the insulating layer 13 is formed one layer more and vias each contacting pads 1A' and 2A' and pattern 3A' including the pads connected in the vias are formed on the insulating layer, such that 1A' and 2A' disposed on 1-layer may be electrically connected with each other through 3A' disposed on 2-layer.

However, with the increased number of layers, the process time and the number of processes are increased, such that the process efficiency may be reduced and the process costs may be increased.

Therefore, as described above in the preferred embodiment of the present invention, the patterns 1A and 2A formed on 1-layer are separately formed so as not to contact the pattern B crossing them and then, portions of the formed patterns 1A and 2A are each formed with the connection terminals 1D and 2D for signal connection.

In the preferred embodiment of the present invention, portions of each pattern 1A and 2A of the open type rerouting pattern A may be provided with the connection terminals 1D and 2D for signal connection, as described above.

In this case, as described in FIG. 1, the connection terminals 1D and 2D for signal connection may be the solder ball, but is not particularly limited thereto and therefore, may be formed of a metal bump, an anisotropic conductive film (ACF), a non conductive film (NCF).

In addition, portions of the short type rerouting other than the open type rerouting pattern A among the rerouting layer 140 may be formed with an external connection terminal 170 as shown in FIG. 1. In this case, the external connection terminal 170 may also be the solder balls, but is not particularly limited thereto. Therefore, the external connection terminal 170 may be formed of the metal bump, the anisotropic conductive film (ACF), and the non conductive film (NCF).

In addition, in the preferred embodiment of the present invention, the connection terminals 1D and 2D for signal connection and the external connection terminal 170 may be made of the same material as each other and may be made of different materials.

In the preferred embodiment of the present invention, the semiconductor package 100 may be formed using the semiconductor wafer but is not particularly limited thereto.

For example, the insulating layer 130 and the rerouting layer are sequentially formed on the wafer (not shown) on which the semiconductor chip 110 is formed and then, the semiconductor wafer is cut, thereby manufacturing the individual semiconductor package 110.

Here, the process of forming a rerouting layer 140 is not particularly limited, but all the processes of forming a circuit that are generally used by those skilled in the art may be applied. The process of forming a circuit is a technology already known by those skilled in the art and the detailed description thereof will be omitted.

Further, in the preferred embodiment of the present invention, a solder resist layer 160 covering the rerouting layer 140 may be further formed on the insulating layer 130 of the first substrate 150.

In this case, the solder resist layer 160, which is formed to perform the structural support and the electrical separation, may be formed to cover the open type rerouting pattern A and the short type rerouting patterns 141 and B but expose a portion of the open type rerouting pattern A and portions of the short type rerouting patterns 141 and B.

As described above, the exposed portion of the open type rerouting pattern A and the short type rerouting patterns 141 and B may each be provided with the connection terminals 1D and 2D for signal connection and the external connection terminal 170.

In the semiconductor package module 300 according to the preferred embodiment of the present invention, the second substrate 200 may be a printed circuit board (PCB).

In the preferred embodiment of the present invention, as shown in FIG. 1, a second substrate 200 may include a first insulating layer 210, a first circuit layer 220 including vias and patterns penetrating through the first insulating layer 210, a second insulating layer 230 formed to cover the first circuit layer 220, and a solder resist layer 240 formed on the second insulating layer 230 and including vias and patterns, and a solder resist layer 250 formed to have an opening part exposing a portion of the second circuit layer 240.

As shown in FIG. 1, the preferred embodiment of the present invention describes an example of a printed circuit board in which insulating layers and circuit layers are formed on both surfaces of a core layer, but is not particularly limited thereto. Therefore, the printed circuit board may be a single layer or a multilayer coreless substrate.

In addition, in the preferred embodiment of the present invention, the second substrate 200 covers the outermost circuit layer but may further include the solder resist layer 250 exposing a portion of the circuit layer.

FIG. 1 shows that the above-mentioned open type rerouting patterns 1A and 2A are each connected with the connection pad C for signal connection of the second substrate through the connection terminals 1D and 2D for signal connection.

The detailed description thereof is as follows.

That is, the open type rerouting patterns 1A and 2A (see FIG. 3) spaced apart from each other so as not to contact the short type rerouting pattern 'B' crossing the insulating layer 130 on the first substrate 150 of the semiconductor package 100 has an opened structure without being electrically connected with each other within the semiconductor package 100 and each bump pad P1 and P3 connected with the open type rerouting patterns 1A and 2A is provided with the connection terminals 1D and 2D for signal connection.

In addition, the second substrate 200 bonded with the semiconductor package 100 through the subsequent process is provided with the connection pad C for signal connection that are electrically connected with each other.

Therefore, the connection terminals 1D and 2D for signal connection bonds the connection pad C for signal connection by bonding the semiconductor package 100 and the second substrate 200 such that the open type rerouting patterns 1A and 2A that are the opened state may be electrically connected by the connection pad C for signal connection.

Describing the difference in the electrical connection structure between the semiconductor package module 30 according to the prior art shown in FIG. 2 and that according to the preferred embodiment, the first substrate 15 of the semiconductor package 10 in the semiconductor package module 30 shown in FIG. 2 is formed of 2-layer unlike the preferred embodiment of the present invention.

The reason is that the patterns 1A' and 2A' electrically connected with each other on the same layer are not connected with each other on one layer due to another pattern B' crossing them, the insulating layer 13 is formed one layer more and then, the pattern 3A' for electrically connecting the patterns 1A' and 2A' with each other are formed on the formed insulating layers 13.

That is, in order to electrically connect the patterns that are not connected with each other on the same layer, the first substrate 15 of the semiconductor package 10 needs to be formed in the multilayer structure.

Unlike this, in the preferred embodiment of the present invention, the patterns that need to be electrically connected for substantially transferring the same signals on the same layer but cannot be connected by other patterns are not connected within the semiconductor package by adding the layers, but the substrate of the semiconductor substrate may be implemented by a single layer by forming the patterns that can electrically connecting patterns separately formed on the main board to be bonded later. As a result, the preferred embodiment of the present invention further reduces the number of processes and the process time than in the multilayer substrate manufacturing according to the prior art, thereby improving the process efficiency.

In addition, in the semiconductor package, the substrate on which the semiconductor chip is mounted may be implemented by the single layer, thereby reducing the module manufacturing costs.

Meanwhile, the preferred embodiment of the present invention describes that the substrate of the semiconductor package formed of 2-layer is implemented by the single layer. This is only one example but the multilayer of three layers or more can also be implemented by the multilayer substrate having the number of layers smaller than this.

The preferred embodiments of the present invention can form the patterns, which are formed over several layers according to the prior art, on a single layer by separating the patterns, which cannot be electrically connected with each other on the same layer, into a plurality and bonding the semiconductor package in which the connection terminals for signal connection for each pattern are formed with the main substrate on which the connection pads for signal connection capable of electrically connecting the separated patterns are formed, thereby reducing the process costs with the reduction in the number of layers.

Further, the preferred embodiments of the present invention can improve the process efficiency by simplifying the number of processes according to the manufacturing process time and the reduction in the number of processes by implementing the patterns formed over several layers as the open type patterns on the single layer.

Although the preferred embodiments of the present invention have been disclosed for illustrative purposes, they are for specifically explaining the present invention and thus a semiconductor package module according to the present invention is not limited thereto, but those to skilled in the art will appreciate that various modifications, additions and substitutions are possible, without departing from the scope and spirit of the invention as disclosed in the accompanying claims.

Accordingly, any and all modifications, variations or equivalent arrangements should be considered to be within the scope of the invention, and the detailed scope of the invention will be disclosed by the accompanying claims.

What is claimed is:

1. A semiconductor package, comprising:
    a semiconductor chip having a bonding pad; and
    a first substrate including a rerouting layer having short type rerouting patterns electrically connected with the bonding pad and formed to be seamlessly connected with each other and a plurality of open type rerouting patterns separately formed on the same layer as the short type rerouting patterns and connection terminals for signal connection each formed on the open type rerouting patterns,
    wherein the plurality of open type rerouting patterns are formed for substantially transferring the same signal and are separated in a separate area, and another pattern formed on the same layer as the open type rerouting patterns crosses the separate area.

2. The semiconductor package as set forth in claim 1, wherein the semiconductor package is a wafer level package (WLP).

3. The semiconductor package as set forth in claim 1, wherein the semiconductor package is formed using a semiconductor wafer.

4. The semiconductor package as set forth in claim 1, wherein the first substrate further includes:
    an insulating layer on which the rerouting layer is formed; and
    an external connection terminal formed in the short type rerouting pattern.

5. The semiconductor package as set forth in claim 4, further comprising a solder resist layer having an opening part formed on the insulating layer to cover the rerouting layer and exposing a portion on which the external connection terminal and the connection terminals for signal connection are formed.

6. The semiconductor package as set forth in claim 4, wherein the external connection terminal is a solder ball.

7. The semiconductor package as set forth in claim 1, wherein the connection terminal for signal connection is a solder ball.

8. A semiconductor package module, comprising:
    a semiconductor package including a semiconductor chip having a bonding pad, and a first substrate including a rerouting layer having short type rerouting patterns electrically connected with the bonding pad and formed to be seamlessly connected with each other and a plurality of open type rerouting patterns separately formed on the same layer as the short type rerouting patterns and connection terminals for signal connection each formed on the open type rerouting patterns, the plurality of open type rerouting patterns being formed for substantially transferring the same signal and being separated in a separate area, and another pattern, formed on the same layer as the open type rerouting patterns, crossing the separate area; and
    a second substrate, on which the semiconductor package is mounted, having connection pads for signal connection to electrically connect the open type rerouting patterns separately formed by being bonded with the connection terminal for signal connection.

9. The semiconductor package module as set forth in claim 8, wherein the semiconductor package is a wafer level package (WLP).

10. The semiconductor package module as set forth in claim 8, wherein the semiconductor package is formed using a semiconductor wafer.

11. The semiconductor package module as set forth in claim 8, wherein the first substrate further includes:
    an insulating layer on which the rerouting layer is formed; and an external connection terminal formed in the short type rerouting pattern.

12. The semiconductor package module as set forth in claim 11, further comprising a solder resist layer having an opening part formed on the insulating layer to cover the rerouting layer and exposing a portion on which the external connection terminal and the connection terminals for signal connection are formed.

13. The semiconductor package module as set forth in claim 11, wherein the external connection terminal is a solder ball.

14. The semiconductor package module as set forth in claim 8, wherein the connection terminal for signal connection is a solder ball.

15. The semiconductor package module as set forth in claim 8, wherein the second substrate is a printed circuit board (PCB).

* * * * *